United States Patent [19]
Nagasu et al.

[11] Patent Number: 5,859,446
[45] Date of Patent: Jan. 12, 1999

[54] DIODE AND POWER CONVERTING APPARATUS

[75] Inventors: Masahiro Nagasu, Hitachinaka; Mutsuhiro Mori, Mito; Hideo Kobayashi; Junichi Sakano, both of Hitachi, all of Japan

[73] Assignee: Hitachi, Ltd., Tokyo, Japan

[21] Appl. No.: 802,882

[22] Filed: Feb. 19, 1997

[30] Foreign Application Priority Data

Feb. 28, 1996 [JP] Japan .................................. 8-040918

[51] Int. Cl.$^6$ ............................................ H01L 29/90
[52] U.S. Cl. ..................... 257/174; 257/121; 257/104; 257/109; 257/161; 257/288; 257/551; 257/603
[58] Field of Search ............................. 257/46, 106, 138, 257/199, 174, 175, 167, 121, 122, 127, 143, 141, 487, 161–163, 922, 477–479, 104, 105, 109, 288, 551, 603, 604

[56] References Cited

U.S. PATENT DOCUMENTS

| | | | |
|---|---|---|---|
| 4,536,816 | 8/1985 | Matsumura et al. | 361/91 |
| 5,162,876 | 11/1992 | Kitagawa et al. | 257/138 |
| 5,574,312 | 11/1996 | Bayerer et al. | 257/707 |

*Primary Examiner*—Steven H. Loke
*Assistant Examiner*—Fetsum Abraham
*Attorney, Agent, or Firm*—Antonelli, Terry, Stout & Kraus, LLP

[57] ABSTRACT

In a diode, the backward length L of an anode electrode in a region, where a semiconductor layer of a $p^+$ conductivity type and an anode electrode do not contact each other, is made longer than the diffusion length of holes in a semiconductor layer of an $n^-$ conductivity type for obtaining a large critical di/dt.

12 Claims, 8 Drawing Sheets

FIG. 1

DIODE AND POWER CONVERTING APPARATUS

BACKGROUND OF THE INVENTION

When a reverse voltage is abruptly applied to a diode in normal operation, a reverse current flows for a while. This is because the reverse voltage causes the carriers stored in the diode to be discharged outside due to the conductivity modulation of the carriers. This reverse current is known as the recovery current of a diode. The peak value ($I_{rp}$) of the recovery current increases as the time variation (di/dt) of the current becomes abrupt in a change from the forward to the reverse direction.

The diode breaks down when di/dt increases excessively at the time of recovery. Generally, the value of di/dt at which the breakdown occurs (hereinafter called the "critical di/dt") is required to be large. In the case of a diode with a low critical di/dt, it has heretofore been the practice to limit the di/dt in the diode by inserting an inductance in the main circuit or by holding down the switching speed of the switching elements used together with the diode in order to protect the diode from breakdown at the time of recovery.

When such an inductance is inserted in the main circuit, however, the voltage generated at the time of recovery of the diode, or the switching of the switching elements, becomes excessively high, and thus the diode and the switching element breakdown; therefore, a protective circuit such as a snubber circuit is needed. Nevertheless, there arise the problems of making a power converting apparatus large-sized, of lowering the conversion efficiency and so forth, because the provision of a protective circuit results in not only increasing the number of parts, but also the incurring of a power loss.

The turn-on time of the switching element needs to be extended to decrease the di/dt in the diode by slowing down the switching speed of the switching element, which would make it necessary to limit the switching frequency and incur an additional cost for cooling the elements because the turn-on loss of the elements increases.

SUMMARY OF THE INVENTION

An object of the present invention, which is made in view of the foregoing problems, is to provide a diode designed to improve its critical di/dt and a power converting apparatus adapted to the requirement for improvement in conversion efficiency and cost reduction.

A diode according to the present invention has a first and a second semiconductor layer for forming the p-n junction, and a first and a second main electrode are connected to the first and second semiconductor layers, respectively. Further, the diode has means for reducing the concentration of the carriers injected from the end portion of the second semiconductor layer in the planar direction.

As a specific means, the distance between a contact area and the p-n junction region between the first and second semiconductor layers is increased, the contact area being positioned between the second semiconductor layer and the second main electrode. In other words, a region where the second main electrode and the second semiconductor layer do not contact each other in the end portion of the second semiconductor layer is widened. The quantity of the carriers injected into a termination region adjacent to the end portion of the second semiconductor layer is reduced because the resistance of the region where the second main electrode and the second semiconductor layer do not contact each other is greater than that of the second main electrode. Therefore, local current concentration in the end portion of the second semiconductor layer at the time of recovery is prevented. Consequently, the diode will hardly break down at the time of recovery, and the critical di/dt is improved.

As another aspect of the invention, the carrier life time in the vicinity of the termination region of the diode is made shorter than that in an active region, whereby the carriers stored in the first semiconductor layer in the vicinity of the termination region are reduced because the recombination of carriers in the termination region is accelerated. Therefore, local current concentration in the end portion of the second semiconductor layer at the time of recovery is prevented, .and the critical di/dt is improved.

Further, a power converting apparatus having a parallel circuit including switching elements, such as IGBTs and diodes embodying the present invention, has the feature that the di/dt of a current flowing through the diode when the switching element is turned on/off can be increased up to at least 2500 A/$\mu$s. According to this feature, an anode reactor necessary for the power converting apparatus may be reduced in size or dispensed with. Moreover, a protective circuit, such as a snubber circuit, may also be reduced in size. Therefore, the power converting apparatus can be reduced in size and weight, and the conversion efficiency can be improved as well.

According to the present invention, moreover, it is possible to produce a power converting apparatus comprising a plurality of modules in a withstand voltage class of 4000 V or higher, the module having a built-in parallel circuit having switching circuits and diodes without the provision of a reactor. The power converting apparatus thus arranged makes it feasible to reduce the size and weight of a large capacity converting apparatus which is used with a high-voltage power supply at a source voltage of about 1500 V or higher.

BRIEF DESCRIPTION OF THE DRAWINGS

FIG. 1 is a perspective view of a planar diode embodying the present invention.

FIG. 4(a) to FIG. 4(c) are diagrams showing the results of experiments made by the present inventors, wherein FIG. 4(a) shows current and voltage waveforms at the time of recovery, and FIG. 4(b) and FIG. 4(c) show the current distribution in the diode.

DETAILED DESCRIPTION OF THE PREFERRED EMBODIMENTS

Figure 1:
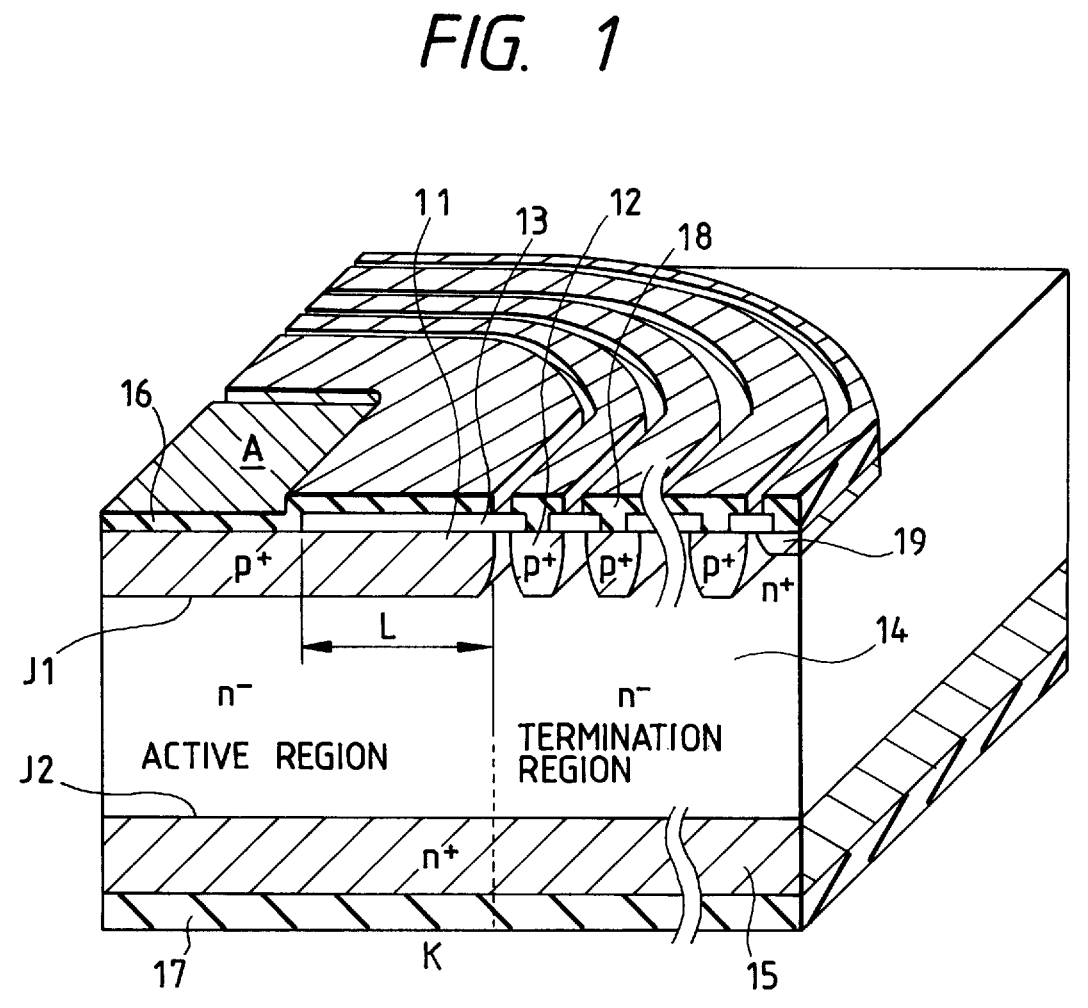
Figure 2:
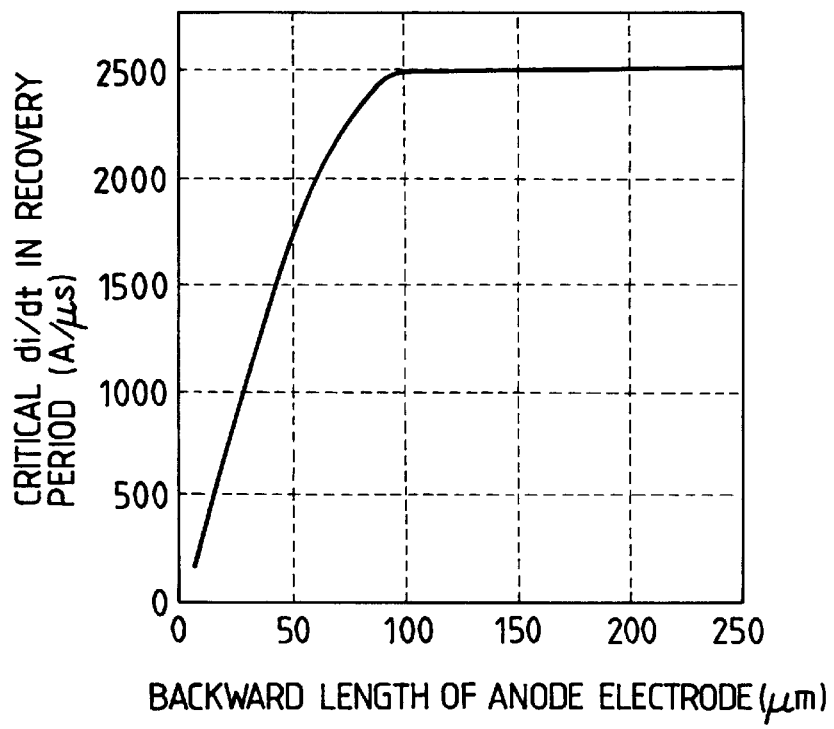
FIG. 2 is a graph showing the relation between L and a critical di/dt in the diode of FIG. 1.

FIG. 1 is a perspective view of a planar diode embodying the present invention.

While a diode remains cutoff, no current flows because a depletion layer extends in a semiconductor layer 14 of an n⁻ conductivity type. When a positive voltage with respect to a cathode electrode 17 is applied to an anode electrode 16, an electric current flows because holes are injected from a semiconductor layer 11 of a p⁺ conductivity type into the semiconductor layer 14. When the diode is cutoff, a semiconductor layer 12 of the p⁺ conductivity type provided partly in a termination region serves to spread the depletion layer extending from the junction J1 between the semiconductor layer 11 of the p⁺ conductivity type and the semiconductor layer 14 of the n⁻ conductivity type to the peripheral portion of the diode to prevent the electric-field concentration in the vicinity of the boundary between an L portion and the termination region.

The termination region is provided so as to surround an active region and the L portion. An insulating film 13 (e.g., an $SiO_3$ film) is formed partly in the vicinity of the surface of the L portion or the termination region, whereby in the L portion, the anode electrode 16 is prevented from contacting the semiconductor layer 11 of the p⁺ conductivity type, whereas in the termination region, an electrode 18 so provided as to contact the semiconductor layer 12 of the p⁺ conductivity type is prevented from contacting the semiconductor layer 14 of the n⁻ conductivity type. The electrode 18 provided in the termination region is concentrically divided with respect to the semiconductor layer 12 of the p⁺ conductivity type. The electrode 18 on the outermost periphery contacts a semiconductor layer 19 of an n⁺ conductivity type. On the cathode-side surface of the semiconductor layer 14 of the n⁻ conductivity type lies a semiconductor layer 15 of the n⁺ conductivity type, and the semiconductor layer 15 contacts the cathode electrode 17. The semiconductor layer 15 of the n⁺ conductivity type injects electrons into the semiconductor layer 14 of the n⁻ conductivity type when a forward voltage is applied.

A reference symbol L denotes the distance (hereinafter referred to as the "backward length of the anode electrode") between the most peripheral portion on the termination region side of the semiconductor layer 11 of the p⁺ conductivity type and that of a portion where the anode electrode 16 and the semiconductor layer 11 of the p⁺ conductivity type contact each other. Incidentally, the description of "the boundary between the active region and the termination region" hereinafter refers to the "most peripheral portion of the semiconductor layer 11 of the p⁺ conductivity type" at the same time.

In the diode of FIG. 1, a forward state is established when positive and negative voltages are applied to the anode and cathode electrodes 16, 17, respectively. Then, holes and electrons are simultaneously injected from the semiconductor layer 11 of the p⁺ conductivity type and the semiconductor layer 15 of the n⁺ conductivity type, respectively. As a result, the carrier concentration increases in the semiconductor layer 14 of the n⁻ conductivity type, so that a state of high injection is created. Therefore, the resistance of the semiconductor layer 14 of the n⁻ conductivity type lowers and a low forward voltage $V_F$ is obtained. On the other hand, the diode is in the reverse state when the negative and positive voltages are applied to the anode electrode 16 and the cathode electrode 17, respectively. When a voltage in the reverse state, instead of the forward state, is abruptly applied, the holes out of the carriers stored in the semiconductor layer 14 of the n⁻ conductivity type are discharged into the semiconductor layer 11 of the p⁺ conductivity type and the electrons are discharged into the semiconductor layer 15 of the n⁺ conductivity type. Therefore, a recovery current flows for a while.

An abrupt change from the forward to the reverse direction, that is, a high di/dt, accelerates the discharging of carriers, whereby a current concentration locally occurs in the semiconductor layer 14 of the n⁻ conductivity type. According to the studies made by the present inventors on current concentration which is likely to break down a diode, it has been found that such a current concentration tends to occur on the boundary between the active and termination regions. As will subsequently be described in detail, the current concentration is prevented by providing the illustrated L portion on the boundary between the active and termination regions according to this embodiment of the present invention.

FIG. 2 shows the relation between the backward length L in the diode and the critical di/dt resulting from the examination made by the present inventors. In this case, the impurity concentration in the semiconductor layer 14 of the n⁻ conductivity type is $1.8 \times 10^{13}$ cm⁻³; the distance between the junctions J1 and J2 is about 400 μs; and the reverse withstand voltage is about 4000 V.

The size of the critical di/dt of the diode is greatly dependent on the backward length L of the anode electrode and the critical di/dt sharply drops when the backward length L is 100 μm or less. When the backward length L is 100 μm, for example, the di/dt is 2500 A/μs, whereas when the former is 10 μm, the latter also decreases by more than one digit to 200 A/μs. One factor in causing the critical di/dt to be greatly dependent on the backward length L is the diffusion length $L_P$ of the holes in the semiconductor layer 14 of the n⁻ conductivity type. Given that the diffusion coefficient and life time of the hole in the semiconductor layer 14 of the n⁻ conductivity type are generally D and τ, the following relationship is established.

$$L_P = \sqrt{(D \cdot \tau)} \qquad \text{(Numerical Formula 1)}$$

In this case, [√( )] represents the square root of the value in the parentheses. In the diode which shows the relationship of FIG. 2, the diffusion coefficient D is about 12 cm²/s when the impurity concentration in the semiconductor layer 14 of the n⁻ conductivity type is $1.8 \times 10^{13}$ cm⁻³. When the life time τ is about 8.3 μs, moreover, $L_P$ comes up to about 100 μm. In other words, the backward length L of the anode electrode in which the critical di/dt sharply drops conforms to the diffusion length of the holes in the semiconductor layer 14 of the n⁻ conductivity type.

The above results indicate that a greater critical di/dt is attainable on the condition that the backward length L of the anode electrode is set in a range satisfying the following relationship:

$$L \geq L_P = \sqrt{(D \cdot \tau)} \qquad \text{(Numerical Formula 2)}$$

However, the forward voltage drop is accelerated and the power loss increases because the active region of the diode is narrowed to increase the backward length L. Therefore, the upper limit of the backward length L of the anode electrode is preferably set to a value at which the area of the active region is about 30% of the total area of the diode, excluding the termination region.

Additionally, a pn-junction having a uniform depth in an active region is preferable for a large critical di/dt. In FIG. 1, the depth of the junction J1 in the active region including the L portion is uniform. The junction J1 has no portion promoting a current crowding during recovery. Consequently, the diode of FIG. 1 has a sufficiently large critical di/dt.

Although FIG. 2 refers to the results obtained from the diode at a withstand voltage of 4000 V, similar results have been obtained by the present inventors from diodes in other withstand voltage classes on the basis of experiments. More specifically, the backward length L which makes a greater critical di/dt available is as follows: 24 $\mu$m or greater in a withstand voltage class of 200 V, 32 $\mu$m or greater in a withstand voltage class of 600 V, 44 $\mu$m or greater in a withstand voltage class of 1200 V, 60 $\mu$m or greater in a withstand voltage class of 2000 V, 86 $\mu$m or greater in a withstand voltage class of 3300 V, 100 $\mu$m or greater in a withstand voltage class of 4000 V, and 120 $\mu$m or greater in a withstand voltage class of 5000 V. Given a withstand voltage of $V_B$(V), the above backward length L ($\mu$m) is expressed by $$L \geq 0.02\ V_B + 20 \qquad \text{(Numerical Formula 3)}$$

and if the backward length L is set to satisfy this relationship, a greater critical di/dt may be achieved. Incidentally, the forward voltages of these diodes are as follows: approximately, 1.2 V–1.5 V in a withstand voltage class of 200 V in the neighborhood of a current density of 100 A/cm$^2$, 1.5 V–1.8 V at a withstand voltage of 600 V, 1.8 V–2.5 V in 1200–2000 classes, and 2.5 V–4 V in a withstand voltage class of 2000 V or higher.

In the case of a diode having a withstand voltage in excess of about 100 V, not only the diffusion length of the holes, but also the forward voltage $V_F$ held in conduction is greatly dependent on the life time of the carrier. Further, the higher the withstand voltage, the thicker the semiconductor layer 14 of the n$^-$ conductivity type becomes, so that the forward voltage $V_F$ becomes greater. Therefore, the present inventors have estimated that the forward voltage $V_F$ might be related in some way to the diffusion length $L_P$ of the holes in the semiconductor layer 14 of the n$^-$ conductivity type and the thickness Wn$^-$ of the semiconductor layer 14, and have examined the relationship.

Figure 3:
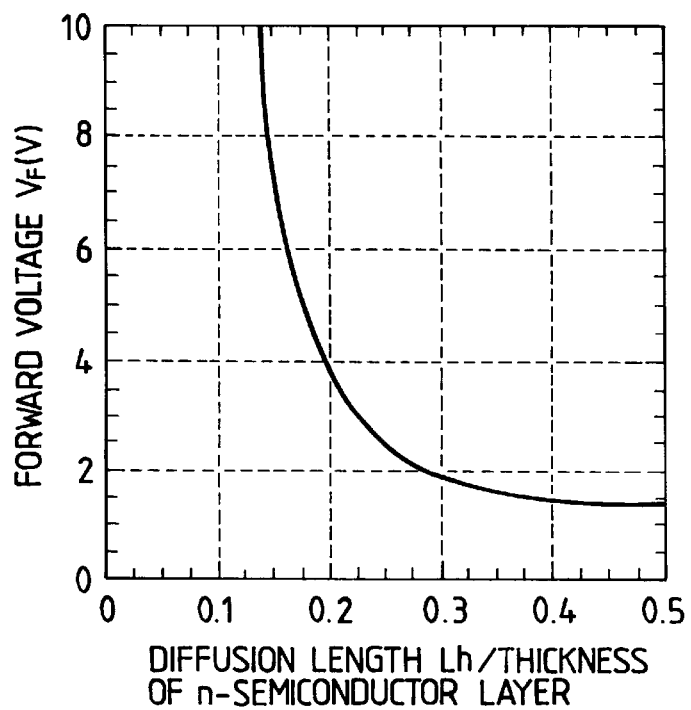
FIG. 3 is a graph showing the relationship between a forward voltage $V_F$ at a current density of 100 A/cm$^2$ and the ratio between the diffusion length $L_P$ of the holes in a semiconductor layer of an n$^-$ conductivity type and the thickness Wn$^-$ of the semiconductor layer.

FIG. 3 shows the relationship between the forward voltage $V_F$ at a current density of 100 A/cm$^{-2}$ and the ratio between the diffusion length $L_P$ of the holes in the semiconductor layer 14 of the n$^-$ conductivity type and the thickness Wn$^-$ of the semiconductor layer 14. This relationship is established in a diode whose withstand voltage is 100 V or higher. Incidentally, the distribution of impurities in the semiconductor layer 11 of the p$^+$ conductivity type and the semiconductor layer 15 of the n$^+$ conductivity type remains within the range of the distribution employed in a conventional planar diode. Typically, the peak concentration is about $10^{18}$ cm$^{-3}$ and the depth is 10–15 $\mu$m with respect to the semiconductor layer 11 of the p$^+$ conductivity type, and the peak concentration is about $10^{19}$–$10^{20}$ cm$^{-3}$ with respect to the semiconductor layer 15 of the n$^+$ conductivity type.

FIG. 3 shows that when the forward voltage $V_F$ and the thickness Wn$^-$ of the semiconductor layer of the n$^-$ conductivity type are set up, the diffusion length $L_P$ of the holes is obtainable. In the case of a diode in which the thickness of the semiconductor layer 14 of the n$^-$ conductivity type is 200 $\mu$m with the forward voltage $V_F$ at 2 V, the diffusion length $L_P$ of the holes is given by $$L_P = 0.28 \times 200 = 56\ \mu m$$

since $L_P/Wn^-$ is 0.28 where the forward voltage $V_F$ becomes 2 v as shown in FIG. 3. Therefore, the backward length L can be set in the range shown by the equation (Numeral Formula 2) on condition that the backward length L of the anode electrode is set higher than this value. With the use of the relationship of FIG. 3, the backward length L of the anode electrode for the purpose of obtaining a great critical di/dt can be set in accordance with the desired forward voltage $V_F$ and the thickness Wn$^-$ of the semiconductor layer 14 of the n$^-$ conductivity type without obtaining the diffusion length $L_P$ from the life time.

Figure 4A:
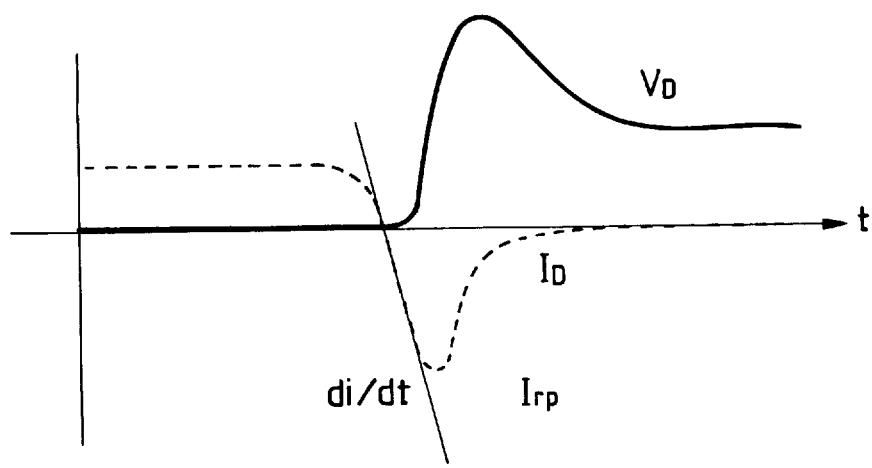
Figure 4B:
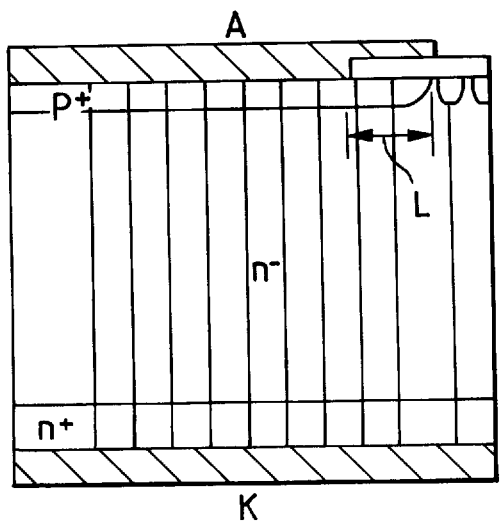
Figure 4C:
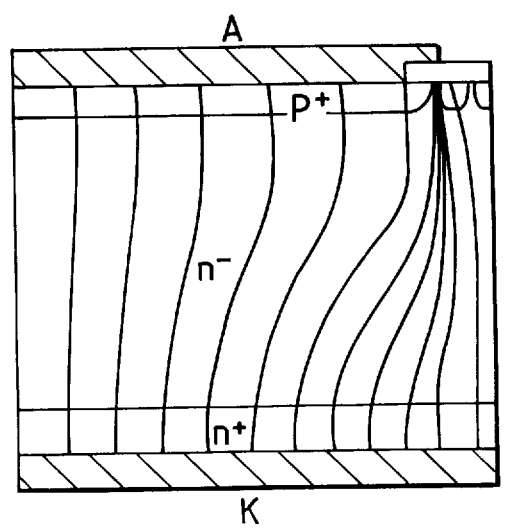

FIG. 4 shows the results of the study made by the present inventors into the current distribution in the diode at the time of recovery. FIG. 4(a) shows the waveforms of the current and the voltage at the time of recovery. FIGS. 4(b) and 4(c) show the current distribution in the diode at the peak value ($I_{rp}$) of the recovery current. FIG. 4(b) refers to the embodiment of FIG. 1 wherein the backward length L of the anode electrode is 400 $\mu$m and FIG. 4(c) refers to the conventional diode wherein the backward length L is 10 $\mu$m. In both cases, the withstand voltage is in a class of 4000 V; the impurity concentration in the semiconductor layer 14 of the n conductivity type is $1.8 \times 10^{13}$ cm$^{-3}$; and the thickness (the distance between the junctions J1 and J2) of the semiconductor layer is 400 $\mu$m. Further, di/dt at the time of recovery is 1500 A/$\mu$s.

In the diode according to this embodiment of the present invention, no current concentration is recognized on the boundary between the active region and the termination region and a uniform current distribution has been obtained. In the conventional diode, on the contrary, the current has been concentrated on the boundary between the active region and the termination region at the time of recovery. Thus, the current distribution in the diode according to this embodiment of the present invention is entirely different from that in the conventional example.

Figure 5A:
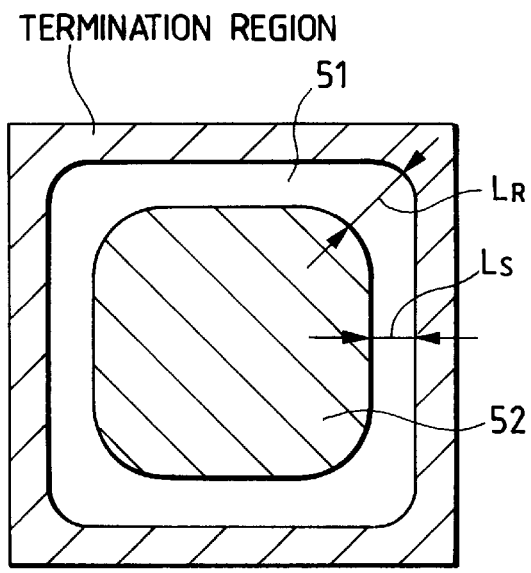
FIG. 5(a) and FIG. 5(b) are diagrams illustrating another embodiment of the present invention.
Figure 5B:
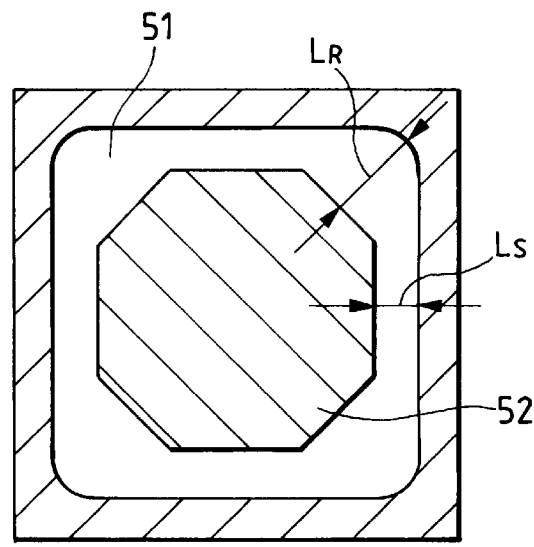

FIGS. 5(a) and 5(b) illustrate patterns on the plane of the anode electrode 16 in another embodiment of the present invention. The anode electrode 16 is made to contact the semiconductor layer 11 of the p$^+$ conductivity type in a region 52. Further, a region 51 is a region where the anode electrode 16 is not in contact with the semiconductor layer 11 of the p$^+$ conductivity type, that is, where it is set backward. In FIG. 5(a), the corners of the region 52 are curved and the width of the corner portion of the region 51 is greater than that of the linear portion thereof; whereas in FIG. 5(b), the corners of the region 52 are linear and the width of the region 51 is also greater in the corner portion than in FIG. 5(a). In other words, the backward length $L_R$ of the corner portion of the anode electrode in the diode of FIGS. 5(a) and 5(b) is greater than the backward length $L_S$ of the linear portion thereof and at least the length $L_R$ satisfies the equation (numerical formula 2) above.

Since the current concentration at the time of recovery is liable to occur particularly in the corner portion, the critical di/dt is improved even when only the aforementioned corner portion ($L_R$) satisfies the equation (numerical formula 2). In addition, a higher critical di/dt will be obtained if the length $L_S$ satisfies the equation (numerical formula 2).

Even when the lengths $L_R$, $L_S$ do not satisfy the equation (numerical formula 2) above, the critical di/dt is higher in the case of $L_R<L_S$ than in the case of $L_R=L_S$, though not so high as that in this embodiment of the invention.

Figure 6:
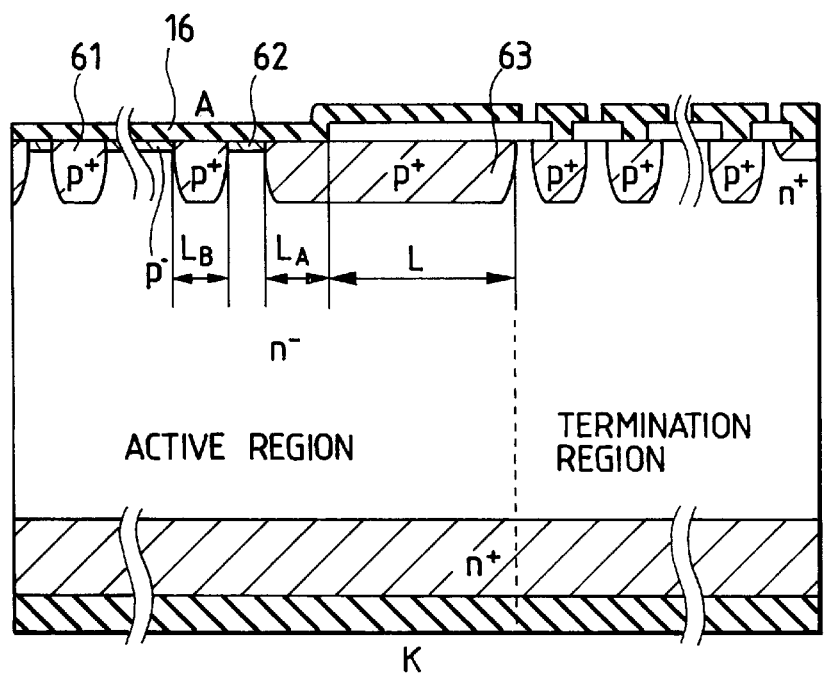
FIG. 6 is a diagrammatic sectional view illustrating still another embodiment of the present invention.

FIG. 6 shows another embodiment of the present invention. According to this embodiment of the present invention, semiconductor layers 61 of the p$^+$ conductivity type and semiconductor layers 62 of the p$^-$ conductivity type are alternately arranged in the active region of a diode. The operational principle of this diode is described in Japanese Patent Laid-Open No. 250670/1991. The semiconductor layer 62 of the p$^-$ conductivity type, whose impurity concentration near the surface is about $10^{16}$ cm$^{-3}$ and whose depth is about 50–100 nm, forms a Schottky junction with the anode electrode 16. The semiconductor layer 62 of the p$^-$ conductivity type is formed by forming the anode electrode 16 with AlSi and then diffusing Al in the AlSi through the semiconductor layer of the n$^-$ conductivity type through heat treatment at several 100° C.

Further, a semiconductor layer 63 of the p$^+$ conductivity type is provided on the boundary between the termination region and the region where the semiconductor layers 61 of the p$^+$ conductivity type and the semiconductor layers 62 of the p$^-$ conductivity type are alternately arranged. As in the embodiment of FIG. 1, the backward length L of the anode electrode in the semiconductor layer 63 of the p$^+$ conductivity type satisfies the equation (numerical formula 2) above. The cathode electrode side and the termination region are of a structure similar to that in the embodiment of FIG. 1.

The electrons transferred from the cathode electrode side are able to easily pass through the semiconductor layer 62 of the p$^-$ conductivity type because the impurity concentration in the semiconductor layer 62 of the p conductivity type is low. Therefore, the carrier concentration on the anode electrode side, which is the main factor in determining the size of the recovery current in the semiconductor layer of the n$^-$ conductivity type, is reduced. Consequently, the peak value $I_{rp}$ of the recovery current becomes small.

As the dimension $L_A$ of the contact area between the anode electrode 16 and the semiconductor layer 63 of the p$^+$ conductivity type widens, however, the carrier concentration on the side of the anode electrode 16 increases because the hole injection from the semiconductor layer 63 of the p$^+$ conductivity type to the semiconductor layer of the n$^-$ conductivity type is accelerated, which results in an increase in the current peak $I_{rp}$ at the time of recovery. Therefore, it is preferred not to increase the length $L_A$ too much. The length $L_A$ is set equal to the dimension $L_B$ of the contact area between the semiconductor layer 61 of the p$^+$ conductivity type, partially provided in the active region, and the anode electrode according to this embodiment of the present invention. The carrier density in the active region is thus uniformized and the current peak $I_{rp}$ is not increased.

Figure 7:
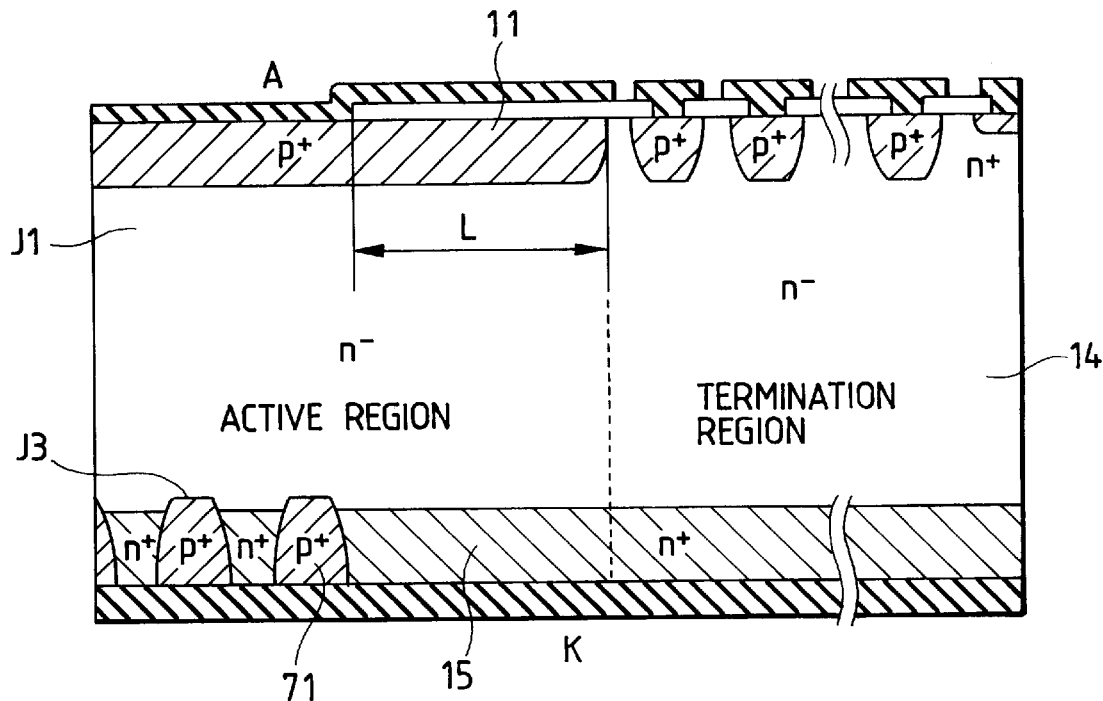
FIG. 7 is a diagrammatic sectional view illustrating still another embodiment of the present invention.

FIG. 7 shows still another embodiment of the present invention. Although the structure on the side A of the anode electrode according to this embodiment is similar to that of the embodiment of FIG. 1, semiconductor layers 71 of the p$^+$ conductivity type are partially provided in the semiconductor layer 15 of the n$^+$ conductivity type on the side K of the cathode electrode.

When an anode electrode A is negatively charged with respect to a cathode electrode K in this diode, a depletion layer extending from the junction interface J1, between the semiconductor layer 14 of the n$^-$ conductivity type and the semiconductor layer 11 of the p$^+$ conductivity type, arrives at the junction J3, between the semiconductor layer 14 of the n$^-$ conductivity type and the semiconductor layer 71 of the p$^+$ conductivity type on the side K of the cathode electrode, at a voltage lower than the voltage generated so as to cause an avalanche breakdown near the junction J1. Given that a voltage value at which the depletion layer arrives at the junction J3 is $V_1$, a reverse current slowly starts flowing at voltage value $V_1$. When the voltage is increased, the holes injected from the semiconductor layer 71 of the p$^+$ conductivity type to the semiconductor layer 14 of the n conductivity type cause the avalanche breakdown near the junction J1. Assuming the voltage value at this time is $V_2$, the current is abruptly increased at $V_2$. A reverse output characteristic like this demonstrates the effect of reducing the generation of an overvoltage as well as electromagnetic noise at the time of recovery of the diode. This process will subsequently be described.

A diode is used in a circuit in which an inductance component (the inductance of a reactor or wiring) connected to the diode in series exists. Therefore, the recovery current of the diode also flows through the inductance connected to the diode in series. As the carrier concentration in the semiconductor layer of the n$^-$ conductivity type lowers, the recovery current is suddenly reduced after its peak value $I_{rp}$ and consequently the inductance causes the reverse voltage of the diode to increase to an extent over the supply voltage. When the reverse voltage becomes excessive, not only is destruction of the diode possible, but also the generation of electromagnetic noise occurs. In the diode according to this embodiment of the present invention, however, the current starts flowing gently at a first reverse voltage value $V_1$ and the decrease in the recovery current slows down, whereby a high voltage due to the inductance and electromagnetic noise are prevented from being generated.

With the provision of the semiconductor layer 71 of the p$^+$ conductivity type on the cathode side, the holes concentrated in the vicinity of the boundary between the active region and the termination region at the time of recovery come to include the holes injected from the semiconductor layer 71 of the p$^+$ conductivity type in addition to the holes stored in the termination region. Therefore, a current concentration is likely to occur on the boundary. According to this embodiment, however, such a current concentration is prevented since the backward length L of the anode electrode A in the semiconductor layer 11 of the p$^+$ conductivity type has satisfied the equation (numerical formula 2) above.

The semiconductor layer 71 of the p$^+$ conductivity type is not provided in the region where the anode electrode is moved backward and the termination region so as to ease the current concentration in this embodiment of the invention.

Figure 8:
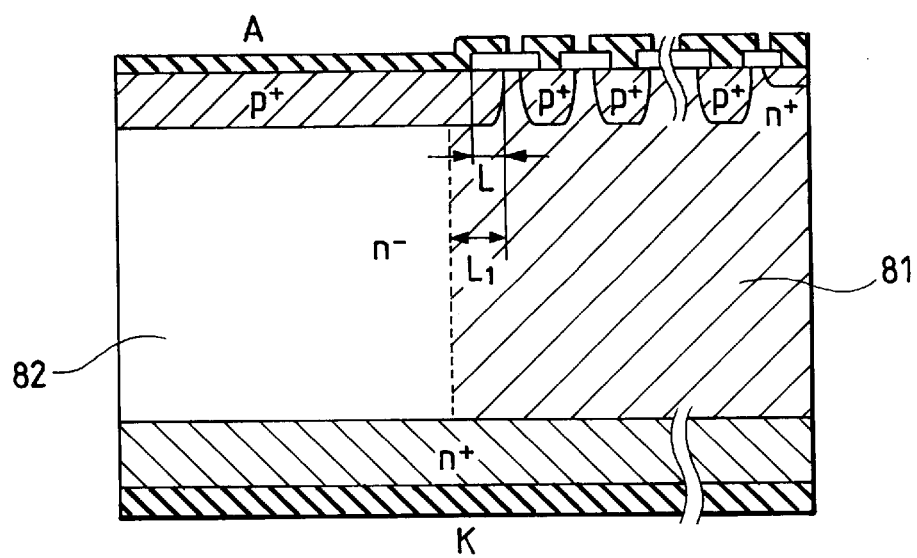
FIG. 8 is a diagrammatic sectional view of still another embodiment of the present invention.

FIG. 8 is a sectional view of still another embodiment of the present invention, wherein the carrier life time in the vicinity 81 of the termination region is differentiated from that of the active region 82. More specifically, the carrier life time in the vicinity 81 of the termination region is made shorter than that of the active region. The backward region of the active region is contained in the region 81 whose life time is short. The backward length L of the anode electrode satisfies the relation defined by the equation (numerical formula 2) above. According to this embodiment, a greater critical di/dt is obtainable when the backward length L is shorter than that of the anode electrode in the preceding embodiment since the carrier density in the termination region is lowered by decreasing the carrier life time in the termination region.

A range in which the carrier life time in the active region is shortened, that is, the range shown by $L_1$ of FIG. 8 is preferably set roughly to be twice as large as the diffusion length of the holes determined by the carrier life time in the region 81. If, however, the carrier life time in the termination region is made excessively short, not only the processing time (e.g., electron beam irradiation time) for shortening the carrier life time, but also leakage current at the time the reverse voltage is applied, increases. In view of this fact, it is undesirable to excessively decrease the diffusion length $L_P$ of the holes, but it is preferable to set the lower limit to about 0.08 $\mu$s, that is, a carrier life time in which the diffusion length is about 10 $\mu$m.

FIG. 9 refers to shortening part of the carrier life time in the thickness direction of a diode as an embodiment of the present invention.

Figure 9A:
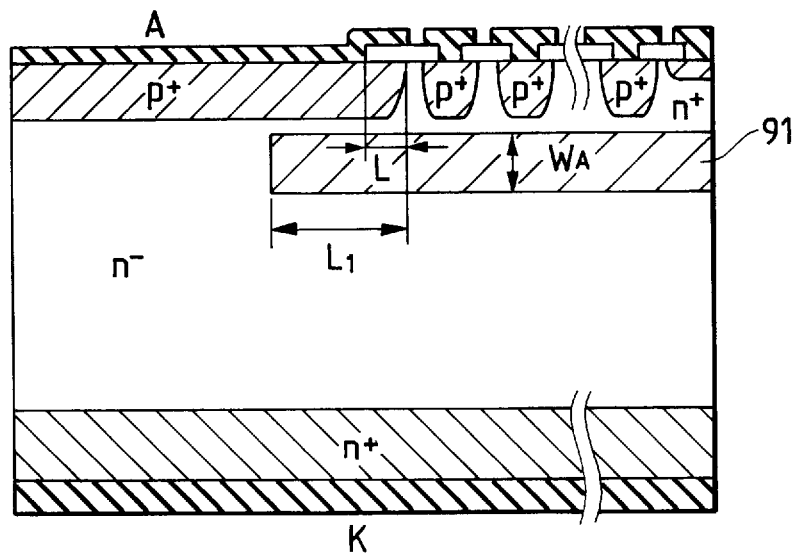
FIG. 9(a) and FIG. 9(b) are diagrammatic sectional views illustrating the operation of shortening a part of carrier life time in the thickness direction of a diode.

FIG. 9(a) refers to shortening the carrier life time on the side A of the anode electrode of the diode according to this embodiment. The carriers concentrated on the boundary between the active region and the termination region at the time of recovery are mainly those stored in the vicinity of the anode electrode side of the termination region. Since the carrier life time in the vicinity of the anode electrode side in the semiconductor layer of the n⁻ conductivity type is shortened according to this embodiment, the density of the carriers stored in that vicinity is reduced.

As the holes are readily injected into the termination region according to this embodiment in comparison with that of FIG. 8, the lengths L and $L_1$ thus set are sufficiently large. More specifically, the lengths L and $L_1$ are set to be about two to four times greater than the diffusion length $L_P$ of the holes in a region 91 where the carrier life time is partially shortened. Further, the distance between the region 91 whose carrier life time is short and the J1 junction is desirably set at about 50 $\mu$m to prevent the leakage current from increasing at the time the reverse voltage is applied.

Figure 9B:
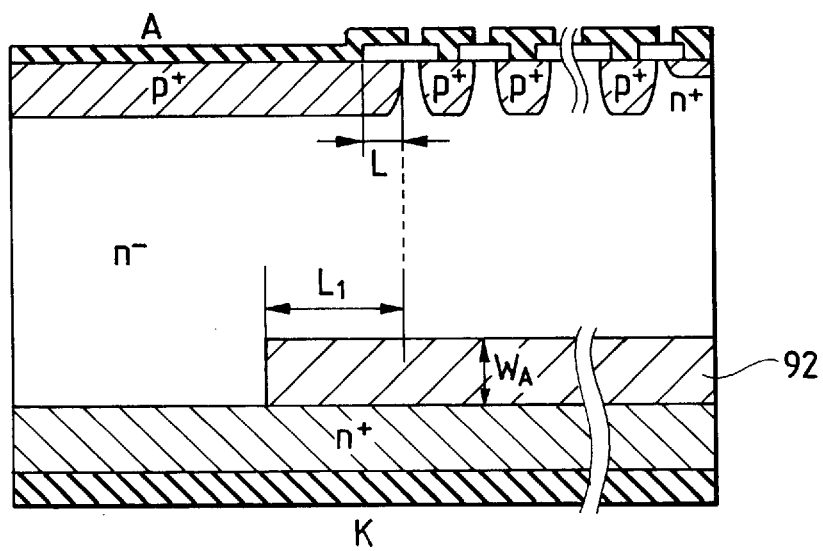

FIG. 9(b) refers to the provision of a region 92 having a short carrier life time in part of the cathode electrode side according to this embodiment. Even in this embodiment, the carrier density in the termination region is reduced and the critical di/dt becomes greater as in the preceding embodiment. Since the reduced carrier life time portion is located on the cathode electrode side according to this embodiment, almost no increase in leakage current results. Therefore, it is possible to make the carrier life time of the region 92 shorter than that in the embodiment of FIG. 9(a). In consequence, the carrier density in the termination region can be reduced without increasing the leakage current and the backward length L can also be shortened according to this embodiment. In this case, the range of the lengths L, $L_1$ is set to be equal to that of FIG. 9(a).

The technique of partially controlling the carrier life time in the thickness direction as shown in the embodiment of FIG. 9 corresponds to the known proton injection method.

A description has been given of several embodiments of the present invention, but the structure of the termination according to the present invention is not limited to examples described in reference to the embodiments thereof. Moreover, the p-type and n-type conductivity types described in the embodiments of the present invention may be reversed in order.

Figure 10:
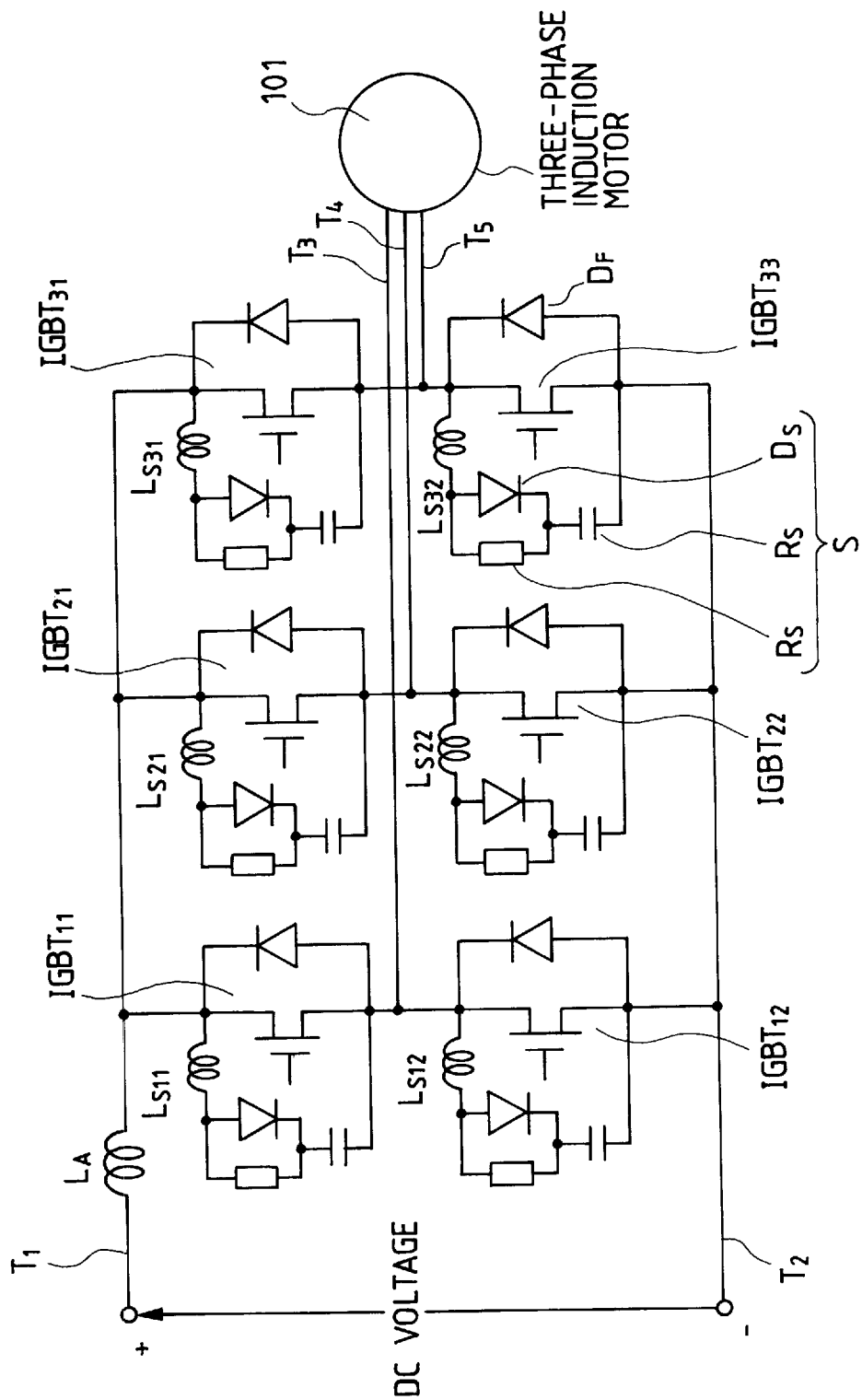
FIG. 10 is a schematic circuit diagram of an example of a power converting apparatus using the diodes according to the embodiment of the present invention.

FIG. 10 shows an example of a power converting apparatus using diodes provided according to the present invention, and what is shown therein is an inverter for driving a three-phase induction motor.

As shown in FIG. 10, two switching elements (e.g., $IGBT_{11}$ and $IGBT_{12}$) are connected in series and a freewheel diode $D_F$ is connected in parallel to each switching element. Further, a so-called snubber circuit S is connected in parallel to each switching element so as to protect the switching element from a sudden voltage rise at the time of switching. The snubber circuit is formed of a capacitor $C_S$ connected in series to a parallel circuit consisting of a diode $D_S$ and a resistor $R_S$. The junctions between two switching elements in individual phases are connected to respective AC terminals $T_3$, $T_4$, $T_5$, which are connected to the three-phase induction motor. The three anode terminals of the switching elements on the upper arm side are commonly connected to a DC terminal $T_1$ to which the high potential side of a DC voltage source is connected. The cathode electrodes of the switching elements on the lower arm side are commonly connected to a DC terminal $T_2$ to which the low potential side of the DC voltage source is connected. The operation of switching each switching element in this inverter is so performed as to convert a direct current to an alternating current, whereby the three-phase induction motor is driven.

Figure 11A:
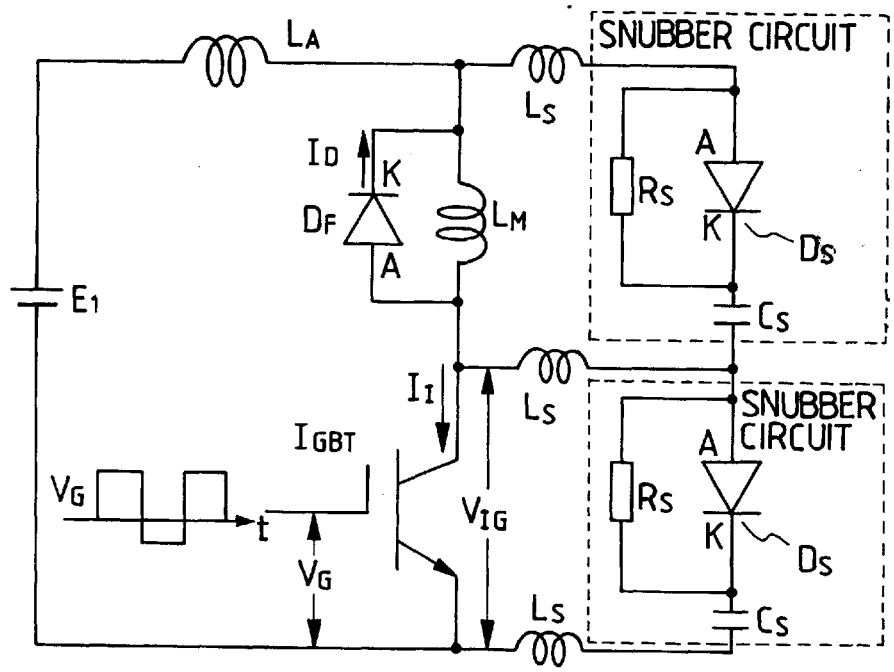
FIG. 11(a) is a schematic circuit diagram and FIG. 11(b) is a waveform diagram illustrating the operation of the inverter of FIG. 10.
Figure 11B:
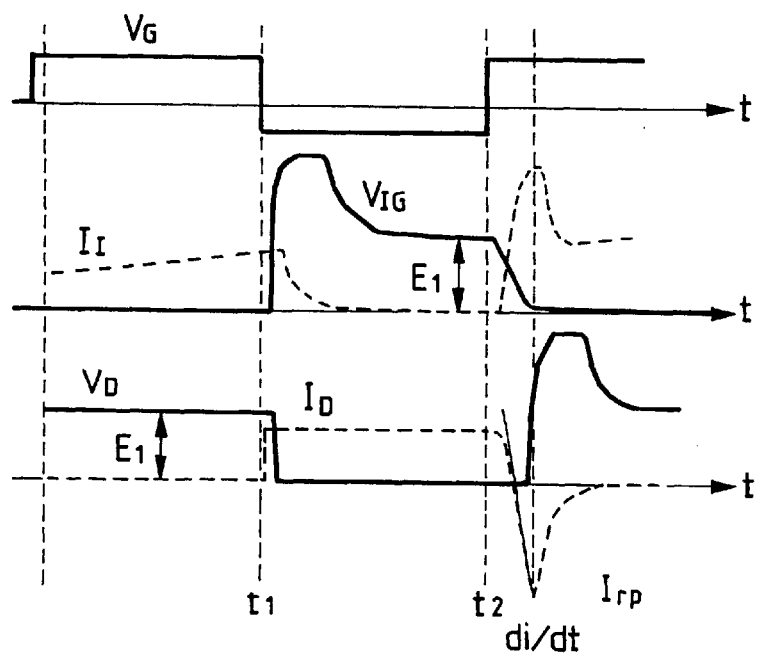

FIG. 11(a) and FIG. 11(b) will be used to explain the operation of the inverter shown in FIG. 10. The circuit of FIG. 11(a) is part of the inverter corresponding to one phase out of the circuit shown in FIG. 10 with the omission of the switching element IGBT of the upper arm and the freewheel diode $D_F$ of the lower arm. Further, an inductance $L_M$ is the inductance of the three-phase induction motor and $L_S$ corresponds to, for example, $L_{S11}$ of FIG. 10. corresponds to, for example, $L_{S11}$ of FIG. 10.

In FIG. 11(a), $D_F$ represents a diode according to the present invention to which the switching element IGBT, the inductance $L_M$ and a DC power supply $E_1$ are connected. Further, snubber circuits are respectively connected in parallel to the freewheel diode $D_F$ and the switching element IGBT via the snubber inductance $L_S$. The snubber circuit has a parallel circuit including a snubber resistor $R_S$ and a snubber diode $D_S$, and snubber capacitor $C_S$. Further, FIG. 11(b) shows current and voltage waveforms in the principal part of the circuit shown in FIG. 11(a). The symbols of the voltage and the current correspond to those shown in FIG. 11(a).

When the switching element IGBT is turned off by applying a negative voltage to a gate signal $V_G$ at time t1, a current Ir flowing through the IGBT abruptly attenuates. However, a current flowing through the inductance $L_A$ in the main circuit and $L_M$ representing the inductance of a load is unable to abruptly decrease. Since the freewheel diode $D_F$ is connected to $L_M$, the current flowing through $L_M$ keeps flowing through the freewheel diode as a current $I_D$. Since the current $I_D$ flows as a forward current then, the voltage $L_M$ between the main electrodes has a value of as small as several $V_S$ at about the ON voltage level of the diode. As the current flowing through the inductance $L_A$ of the main circuit is abruptly cut off by the IGBT, on the other hand, the collector voltage $V_{IG}$ of the IGBT is increased, so that an excess voltage is caused to be generated in the IGBT. In order to prevent the generation of such an excessive voltage, the snubber circuit is connected in parallel to the switching element, as shown in FIG. 11(a), to control the high voltage.

When a positive voltage is subsequently applied to the gate signal $V_G$ at time t2, the IGBT is turned on and the current $I_D$ flowing through the freewheel diode begins to decrease and ultimately the recovery current flows in the negative direction (the direction directed from the cathode electrode K toward the anode electrode A). Since the recovery current flows because of the carriers stored in the diode, the absolute value of the current decreases in the direction of zero as the carrier quantity becomes smaller after the recovery current exceeds the peak value $I_{rp}$. The recovery current of the diode also flows through the inductance $L_A$ of the main circuit, and as its absolute value decreases, a high voltage is applied to the diode. Even in this case, the snubber circuit connected in parallel to the freewheel diode prevents the high voltage generated between the main terminals of the diode.

The degree of time variation at which the current of the freewheel diode varies in the reverse direction instead of the forward direction, that is, the di/dt shown in FIG. 11(b), is determined by the inductance $L_A$ existing in the main circuit and the switching speed of the switching element IGBT.

Since the freewheel diode according to the embodiment has an outstanding critical di/dt in the circuit shown in FIGS. 10, 11(a), the inductance LA in the main circuit can be lowered, whereas it becomes unnecessary to control the switching speed of the switching elements. Therefore, it is possible to decrease the power loss of the inverter, reduce the size of the snubber circuit and secure high-frequency operation.

In the case of a diode having a withstand voltage of about 4 kV, for example, a typical conventional diode breaks down at a di/dt of about 200 A/μs, which necessitates an inductance $L_A$ of at least 7.5 μH (=1500 (V)/200 (A/μs)) or greater in the main circuit to operate the diode with a power supply of 1.5 kV. In a main circuit having a built-in freewheel diode, IGBT and a module of a withstand voltage of 4 kV or greater and currents ranging from 100 A to several 1000 A, the wiring length in the main circuit will be at least about 1 m long. As the inductance of the wiring is normally about 1 μH with a wiring length of 1 m, an anode reactor of about 6.5 pH needs to be inserted in the main circuit. On the other hand, the diode in the class of 4 kV according to the embodiment of the present invention is free from breakdown up to a di/dt of 2500 A/μs or greater. Therefore, the inductance can be lowered up to 0.6 pH (=1500 (V)/2500 (A/μs)). As this value is less than that of the inductance of the main circuit wiring, the insertion of the anode reactor in the main circuit is unnecessary. The inverter can thus be made small-sized. Moreover, since the energy stored in the inductance of the main circuit is reduced, the generation of a high voltage can be suppressed. The capacitance of the capacitor of the snubber circuit is reduced accordingly.

Incidentally, the diode according to this embodiment may be used as not only a freewheel diode, but also as a snubber diode in a snubber circuit. In this case, the desired effect is also achievable because the value of the inductance $L_S$ of the snubber circuit is reduced.

The same effect as described above will be achieved by the diode according to this embodiment even though such a diode is used in an invertor for driving a three-phase induction motor and any other inverters or convertors.

According to the present invention, a diode having a great critical di/dt is obtainable. When the diode according to the present invention is used in a power converting apparatus, the apparatus can be made small-sized and the generation of an overvoltage can also be suppressed.

What is claimed is:

1. A diode comprising:
   a first semiconductor layer of a first conductivity type;
   a second semiconductor layer of a second conductivity type provided in said first semiconductor layer, said second semiconductor layer having a plan view area, with respect to an outer surface thereof, such that a junction between the first and second semiconductor layers forms an outer periphery on one end side of said second semiconductor layer;
   a first main electrode electrically connected to said first semiconductor layer; and
   a second main electrode positioned directly above said second semiconductor layer and limited to cover a plan view area bounded by said junction,
   wherein said second main electrode is contacting only a part of an entire plan view surface area of said second semiconductor layer, the contacting part of said second semiconductor layer defining a distal location from the outer periphery thereof, defined by said junction, and
   wherein a distance between the contacting part and said junction, measured in a direction parallel to said outer surface, is not less than a diffusion length of minority carriers in said first semiconductor layer.

2. A diode according to claim 1, wherein the diffusion length is obtained from a relationship between the forward voltage between the first and second main electrodes at a current density of 100 A/cm$^2$ and a ratio between a diffusion length of holes in the first semiconductor layer and a thickness of the first semiconductor layer.

3. A diode according to claim 1, further comprising a third semiconductor layer of the second conductivity type wherein the impurity concentration is lower than that in the second semiconductor layer, the third semiconductor layer being in contact with the second main electrode.

4. A diode according to claim 1, further comprising a third semiconductor layer of the second conductivity type, the third semiconductor layer being in contact with the first main electrode.

5. A diode according to claim 1,
   wherein said first semiconductor layer is contacted to said first main electrode at a side of a first principal surface and said outer surface of said second semiconductor layer constitutes a second principal surface at an opposing side of said first semiconductor layer; and
   wherein said second main electrode has a part thereof which insulatedly extends above said second semiconductor layer at the spacing distance between the contacting part and said junction.

6. A diode comprising:
   a first semiconductor layer of a first conductivity type;
   a second semiconductor layer of a second conductivity type provided in the first semiconductor layer, said second semiconductor layer having a plan view area, with respect to an outer surface thereof, such that a junction between the first and second semiconductor layers forms an outer periphery on one end side of said second semiconductor layer;
   a first main electrode electrically connected to the first semiconductor layer; and
   a second main electrode positioned directly above said second semiconductor layer and limited to cover a plan view area bounded by said junction,
   wherein said second main electrode is contacting only a part of an entire plan view surface area of said second semiconductor layer, the contacting part of said second semiconductor layer defining a distal location from the outer periphery thereof, defined by said function, and
   wherein a distance between the contacting part and said junction, measured in a direction parallel to said outer surface, is greater in a corner portion of the surface area of said second semiconductor layer than in a linear portion thereof.

7. A diode comprising:
   a first semiconductor layer of a first conductivity type;
   a second semiconductor layer of a second conductivity type provided in the first semiconductor layer, said second semiconductor layer having a plan view area, with respect to an outer surface thereof, such that a function between the first and second semiconductor layers forms an outer periphery on one end side of said second semiconductor layer;

a first main electrode electrically connected to the first semiconductor layer;

a second main electrode positioned directly above said second semiconductor layer and limited to cover a plan view area bounded by said junction, wherein said second main electrode is contacting only a part of an entire plan view surface area of said second semiconductor layer, the contacting part of said second semiconductor layer defining a distal location from the outer periphery thereof, defined by said junction, and a termination region disposed around the second semiconductor layer, wherein the life time of minority carriers in a portion of said first semiconductor layer located between said termination region and said junction is shorter than that of a vertical projection portion thereof of said contact part.

8. A diode according to claim 4, wherein said portion of said first semiconductor layer is positioned on the first main electrode side of the first semiconductor layer.

9. A diode according to claim 4, wherein said portion of said first semiconductor layer is positioned on the second main electrode side of the first semiconductor layer.

10. A power converting apparatus comprising a parallel circuit having switching elements and diodes, at least one diode comprising:

a first semiconductor layer of a first conductivity type;

a second semiconductor layer of a second conductivity type provided in the first semiconductor layer, said second semiconductor layer having a plan view area, with respect to an outer surface thereof, such that a junction between the first and second semiconductor layers forms an outer periphery on one end side of said second semiconductor layer;

a first main electrode electrically connected to the first semiconductor layer;

a second main electrode positioned directly above said second semiconductor layer and limited to cover a plan view area bounded by said junction, wherein said second main electrode is contacting only a part of an entire plan view surface area of said second semiconductor layer, the contacting part of said second semiconductor layer defining a distal location from the outer periphery thereof, defined by said junction; and means for reducing the concentration of the carriers injected from the part of said second semiconductor layer above which said second main electrode is provided, wherein di/dt of a current flowing through the diode when the switching element is turned on/off can be increased up to at least 2500 A/$\mu$s.

11. A diode comprising:

a first semiconductor layer of a first conductivity type;

a second semiconductor layer of a second conductivity type provided in the first semiconductor layer, said second semiconductor layer having a plan view area, with respect to an outer surface thereof, such that a junction between the first and second semiconductor layers forms an outer periphery on one end side of said second semiconductor layer;

a first main electrode electrically connected to the first semiconductor layer; and a second main electrode positioned directly above said second semiconductor layer and limited to cover a plan view area bounded by said junction, wherein said second main electrode is contacting only a part of an entire plan view surface area of said second semiconductor layer, the contacting part of said second semiconductor layer defining a distal location from the outer periphery thereof, defined by said junction, and wherein a distance L ($\mu$m) between the contacting part and said junction satisfies L>0.02 $V_B$+20 when the withstand voltage at the diode thus configured is set at $V_B$ (V).

12. A power converting apparatus comprising a parallel circuit having switching elements and diodes, at least one diode comprising:

a first semiconductor layer of a first conductivity type;

a second semiconductor layer of a second conductivity type provided in the first semiconductor layer, said second semiconductor layer having a plan view area, with respect to an outer surface thereof, such that a junction between the first and second semiconductor layers forms an outer periphery on one end side of said second semiconductor layer;

a first main electrode electrically connected to the first semiconductor layer: and a second main electrode positioned directly above said second semiconductor layer and limited to cover a plan view area bounded by said junction, wherein said second main electrode is contacting only a part of an entire plan view surface area of said second semiconductor layer, the contacting part of said second semiconductor layer defining a distal location from the outer periphery thereof, defined by said junction, and wherein a distance L ($\mu$m) between the contacting part and said junction satisfies L>0.02 $V_B$+20 when the withstand voltage at the diode thus configured is set at $V_B$ (V).

* * * * *